United States Patent
Centen et al.

(10) Patent No.: US 10,270,997 B2
(45) Date of Patent: Apr. 23, 2019

(54) CROSS PIXEL INTERCONNECTION

(71) Applicant: GVBB HOLDINGS S.A.R.L., Luxembourg (LU)

(72) Inventors: Petrus Gijsbertus Centen, Goirle (NL); Jeroen Rotte, Breda (NL); Juul Josephus Johannes Van Den Heijkant, Breda (NL); Rudolf Van Ree, Breda (NL)

(73) Assignee: GVBB HOLDINGS S.A.R.L., Luxembourg (LU)

( * ) Notice: Subject to any disclaimer, the term of this patent is extended or adjusted under 35 U.S.C. 154(b) by 0 days.

(21) Appl. No.: 15/362,023

(22) Filed: Nov. 28, 2016

(65) Prior Publication Data

US 2018/0070036 A1    Mar. 8, 2018

Related U.S. Application Data

(60) Provisional application No. 62/385,027, filed on Sep. 8, 2016.

(51) Int. Cl.
*H01L 27/146* (2006.01)
*H04N 5/374* (2011.01)
(Continued)

(52) U.S. Cl.
CPC ....... *H04N 5/374* (2013.01); *H01L 27/14614* (2013.01); *H01L 27/14643* (2013.01);
(Continued)

(58) Field of Classification Search
None
See application file for complete search history.

(56) References Cited

U.S. PATENT DOCUMENTS 8,471,315 B1    6/2013    Hynecek et al.
2005/0057674 A1    3/2005    Krymski et al.
(Continued)

FOREIGN PATENT DOCUMENTS

EP    1139658 A2    5/2005
JP    2010268529 A    11/2010

OTHER PUBLICATIONS

International Search Report & Written Opinion issued in PCT/EP2017/072630 dated Nov. 28, 2017.
(Continued)

*Primary Examiner* — Mark T Monk
(74) *Attorney, Agent, or Firm* — Arent Fox LLP

(57) ABSTRACT

A CMOS image sensor with reducing interconnections is provided. The CMOS image sensor may include a first row of pixels that includes a first pixel. The first pixel may include a first plurality of photodiodes and a first plurality of transfer gates. Each of the first plurality of photodiodes may be associated with a corresponding one of the first plurality of transfer gates. The CMOS image sensor may include a second row of pixels that includes a second pixel. The second pixel may include a second plurality of photodiodes and a second plurality of transfer gates. Each of the second plurality of photodiodes may be associated with a corresponding one of the second plurality of transfer gates. A first one of the transfer gates of the first plurality of transfer gates may be coupled to a first one of the transfer gates of the second plurality of transfer gates.

14 Claims, 8 Drawing Sheets

(51) Int. Cl.
*H04N 5/378* (2011.01)
*H04N 5/345* (2011.01)
*H04N 5/363* (2011.01)
*H04N 5/3745* (2011.01)
*H04N 5/357* (2011.01)
*H04N 5/376* (2011.01)

(52) U.S. Cl.
CPC ......... *H04N 5/3452* (2013.01); *H04N 5/3575* (2013.01); *H04N 5/363* (2013.01); *H04N 5/378* (2013.01); *H04N 5/37452* (2013.01); *H04N 5/37457* (2013.01); *H04N 5/3765* (2013.01); *H04N 5/37455* (2013.01)

(56) References Cited

U.S. PATENT DOCUMENTS

| | | |
|---|---|---|
| 2009/0108176 A1 | 4/2009 | Blanquart |
| 2010/0309340 A1 | 12/2010 | Border et al. |
| 2013/0057744 A1 | 3/2013 | Minagawa et al. |
| 2014/0263964 A1 | 9/2014 | Yang et al. |
| 2014/0333809 A1 | 11/2014 | Bock |
| 2016/0165159 A1* | 6/2016 | Hseih ................. H04N 5/23235 348/273 |
| 2016/0353034 A1 | 12/2016 | Mauritzson et al. |

OTHER PUBLICATIONS

Non-Final Office Action dated May 30, 2018, issued in U.S. Appl. No. 15/697,349.
International Search Report and Written Opinion dated Aug. 16, 2018, regarding PCT/CA2018/050636.

* cited by examiner

CROSS PIXEL INTERCONNECTION

CROSS-REFERENCE TO RELATED APPLICATION(S)

This application claims the benefit of U.S. Provisional Application Ser. No. 62/385,027, entitled "DIFFERENTIAL DIGITAL DOUBLE SAMPLING METHOD AND CMOS IMAGE SENSOR FOR PERFORMING SAME" and filed on Sep. 8, 2016, which is expressly incorporated by reference herein in its entirety.

TECHNICAL FIELD

The disclosure herein generally relates to CMOS images sensors, and, more particularly, to a cross pixel interconnection.

BACKGROUND

Complementary metal oxide semiconductor ("CMOS") image sensors are widely used in digital cameras to produce digital images by converting optical signals into electrical signals. In operation, CMOS image sensors may convert an optical signal into an electrical signal using a multitude of pixels that each include a photodiode and a read-out circuit. The photodiode generates electric charges using absorbed light, converts the generated electric charges into an analog current, and delivers the analog current to the read-out circuit. The read-out circuit may convert the analog signal into a digital signal and outputs the digital signal.

Certain CMOS image sensor pixel circuits are formed using four transistors and are known and referred to as 4T image sensor pixels or "4T pixels." FIG. 1 illustrates an exemplary design of a 4T pixel 110 connected to a bit-line 120. As shown, the 4T CMOS image sensor pixel 110 includes a photodiode ("PD") that provides the photon to electron conversion, while a floating diffusion ("FD") point provides the electron to voltage conversion. The voltage per electron conversion of the FD is known as conversion gain ("CG") and is an important parameter for CMOS image sensors. Conversion gain boosts the pixel signal relative to the analog noise, thereby reducing the noise floor, and thereby enabling performance at lower light levels.

For such CMOS image sensors, during the analog-to-digital conversion process, a comparator receives an analog voltage and compares the analog voltage with a ramp voltage. In one implementation of a CMOS image sensor, the comparator compares the analog voltage with the ramp voltage, and uses a counter to count until the ramp voltage is greater than an analog voltage. Once the counter stops counting, a count value is digital data corresponding to an analog voltage, that is, the count value is the digital data into which the analog voltage has been converted.

Referring to FIG. 1, the pixel is reset when the reset transistor ("RST") and transfer gate ("TG") are turned on simultaneously, setting both the floating diffusion FD and the photodiode PD to the VDD voltage level. Next, the transfer gate TG is turned off (disconnecting the photodiode PD and floating diffusion FD) and the photodiode PD is left to integrate light.

After integration, the signal measurement occurs. First, the reset transistor RST is turned on and off to reset the floating diffusion FD. Immediately after this, the reset level is sampled from the floating diffusion FD and stored on the column circuit, i.e., bit-line 120. Next, the transfer gate TG is turned on and off which allows charge on the photodiode PD to transfer to the floating diffusion (FD). Once the charge transfer is complete, this charge (the photodiode signal level plus the floating diffusion reset level) is measured and stored on bit-line 120 as well.

These two stored voltages are then differenced ($D_{sig}-D_{rst}$) to determine the photodiode signal level. The 4T pixel design 110 significantly improves the performance of other CMOS image sensors, reducing both read noise and image lag. In addition, the design reduces pixel source follower offsets and the like.

SUMMARY

In an aspect of the disclosure, a CMOS image sensor with reducing interconnections is provided. The CMOS image sensor may include a first row of pixels that includes a first pixel. The first pixel may include a first plurality of photodiodes and a first plurality of transfer gates. Each of the first plurality of photodiodes may be associated with a corresponding one of the first plurality of transfer gates. The CMOS image sensor may include a second row of pixels that includes a second pixel. The second pixel may include a second plurality of photodiodes and a second plurality of transfer gates. Each of the second plurality of photodiodes may be associated with a corresponding one of the second plurality of transfer gates. A first one of the transfer gates of the first plurality of transfer gates may be coupled to a first one of the transfer gates of the second plurality of transfer gates.

In another aspect, a method and an apparatus for performing digital sampling of pixel values of a CMOS image sensor are provided. The apparatus may read out a first pixel value from a first pixel on a first pixel row by applying a first signal to the first pixel. The first pixel may include a first plurality of photodiodes. The first pixel value from the first pixel may be read out from a first one of the photodiodes of the first plurality of photodiodes. The apparatus may read out a first pixel value from a second pixel on a second pixel row by concurrently applying the first signal to the second pixel. The second pixel may include a second plurality of photodiodes. The first pixel value from the second pixel may be read out from a first one of the photodiodes of the second plurality of photodiodes.

Other aspects of apparatuses described herein will become readily apparent to those skilled in the art based on the following detailed description, wherein various aspects of memory are shown and described by way of illustration. These aspects may be implemented in many different forms and its details may be modified in various ways without deviating from the scope of the present invention. Accordingly, the drawings and detailed description provided herein are to be regarded as illustrative in nature and not as restricting the scope of the claims.

BRIEF DESCRIPTION OF THE DRAWINGS

The accompanying drawings, which are incorporated into and constitute a part of this specification, illustrate one or more example aspects of the present disclosure and, together with the detailed description, serve to explain their principles and implementations.

DETAILED DESCRIPTION

Figure 1:
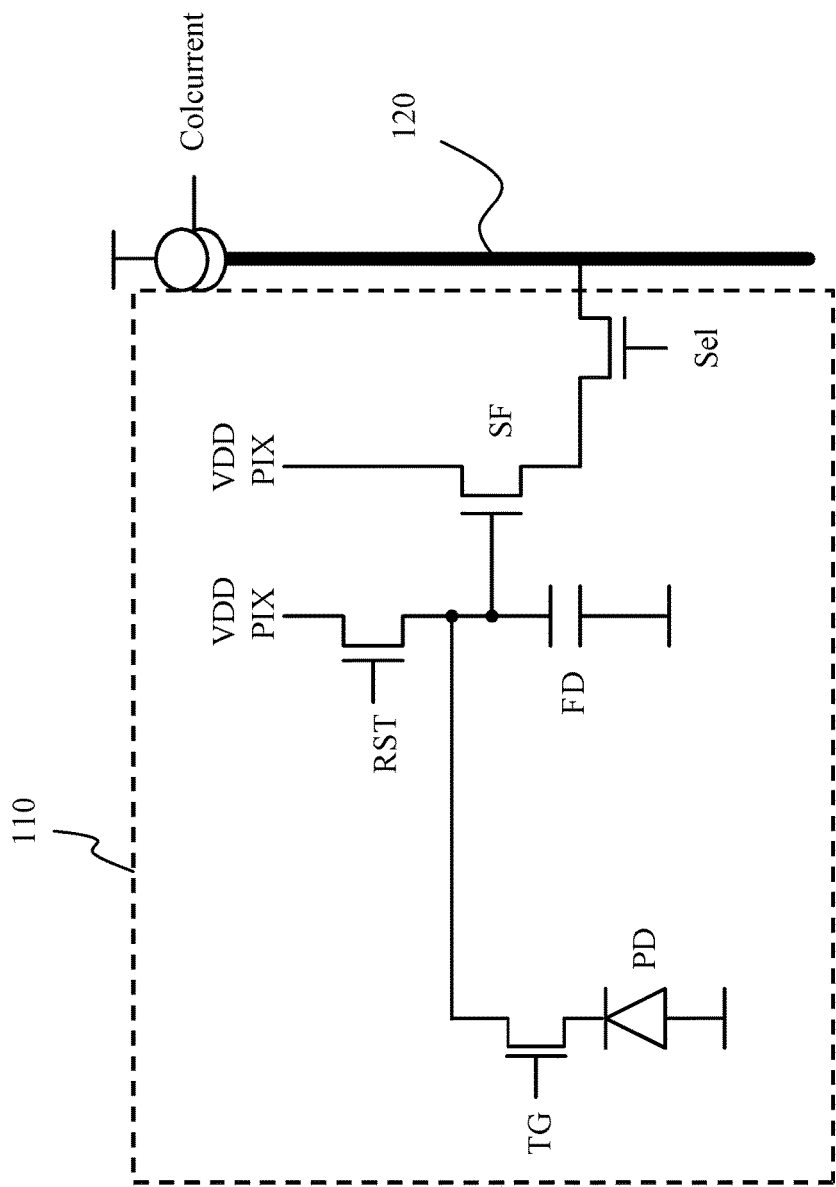
FIG. 1 illustrates a conventional design of a 4T pixel configuration of a CMOS image sensor connected to a column circuit.

Various aspects of the disclosed system and method are now described with reference to the drawings, wherein like reference numerals are used to refer to like elements throughout. In the following description, for purposes of explanation, numerous specific details are set forth in order to promote a thorough understanding of one or more aspects of the disclosure. It may be evident in some or all instances, however, that any aspects described below can be practiced without adopting the specific design details described below. In other instances, well-known structures and devices are shown in block diagram form in order to facilitate description of one or more aspects. The following presents a simplified summary of one or more aspects of the invention in order to provide a basic understanding thereof.

In one configuration, the number of rows and columns of photodiodes in a pixel array of a CMOS image sensor may both be doubled. As a result, there may be four time of photodiodes in an image area compared with the number of photodiodes when the image area is filled with 4T pixels. In such a configuration, each pixel area that may originally be occupied by one 4T pixel may contain four photodiodes. Such a pixel that contains four photodiodes may be referred to as a 4T shared pixel, or a shared pixel.

Figure 2:
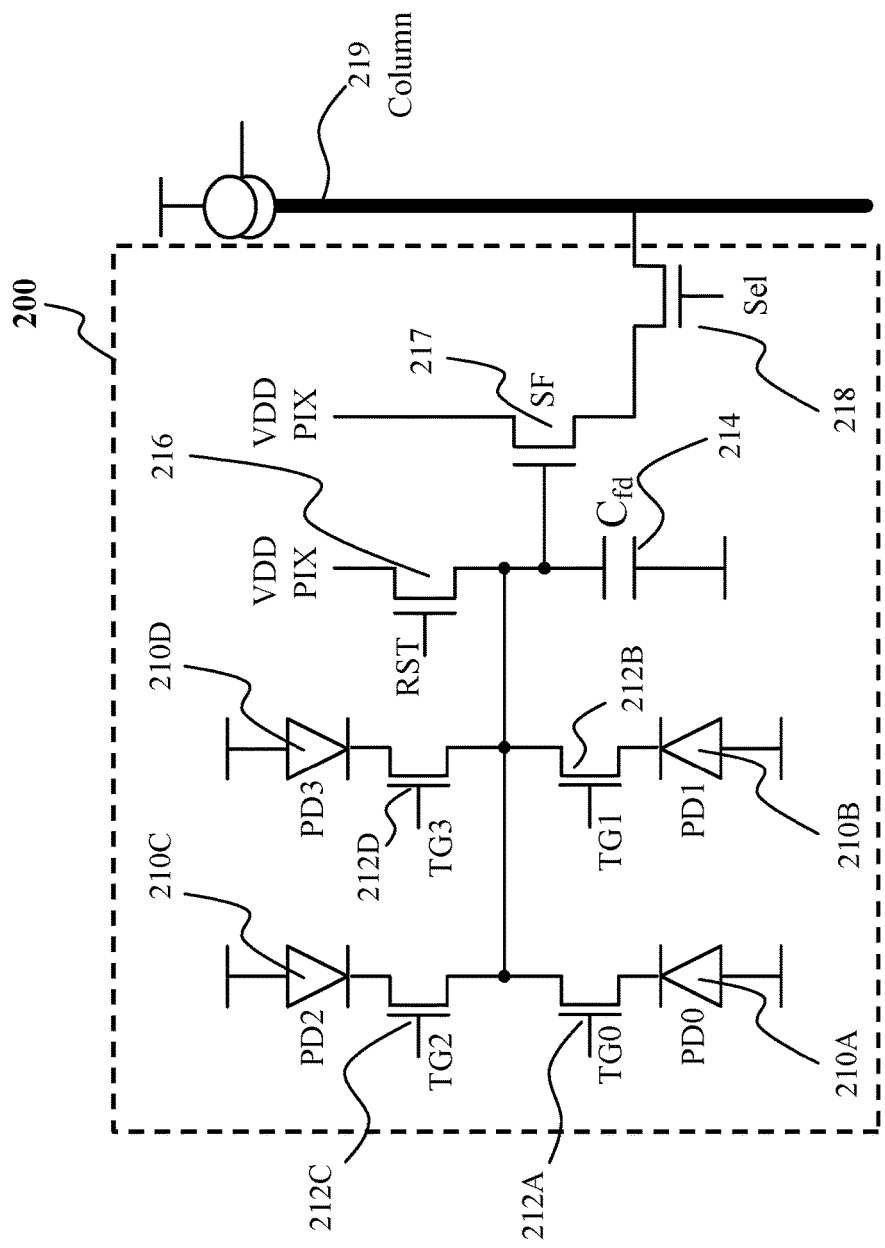
FIG. 2 illustrates a schematic diagram of an exemplary 4T shared pixel CMOS image sensor that can be implemented in connection with an exemplary embodiment.

FIG. 2 illustrates a schematic diagram of an exemplary 4T shared pixel CMOS image sensor that can be implemented in connection with an exemplary embodiment. The shared pixel 200 includes a similar configuration as the 4T pixel described above except that it includes four sub-pixels, e.g., photodiodes 210A, 210B, 210C and 210D (also shown as PD0-PD3) that are each driven by a respective transfer gate (shown as TG0-TG3). The transfer gates, which are CMOS transistors, are identified by reference numerals 212A, 212B, 212C and 212D. As shown, each of the transfer gates 212A-112D shares a common readout circuit and is connected to floating diffusion point, 214, i.e., capacitor $C_{fd}$. As further shown, both transistor 216 (reset transistor) and transistor 217 have drains connected to the voltage source of the pixel (e.g., VDD PIX). The source of reset transistor 216 is connected to the floating diffusion point 214 and the source of transistor 217 is connected to the drain of the select transistor 218. The source of select transistor 218 is connected to the column circuit 219.

As will be discussed in more detail below, each sub-pixel (i.e., each of photodiodes PD0-PD3) can be read out separately by activating its corresponding transfer gate. Thus, to read out photodiode 210A, the transfer gate 212A is turned on/activated. Similarly, photodiode 210B is read out by activating transfer gate 212B, and so forth. In some instances, multiple sub-pixels will be read out at the same time as a single read operation by activating the respective transfer gates simultaneously.

In order to take advantage of the higher resolution provided by the shared pixels, each photodiode of a shared pixel may need to be read out individually. To read out each photodiode of a shared pixel individually, four wires may be needed to addressed each photodiodes individually. Having four wires connected to a shared pixel may degrade the performance of the shared pixel, e.g., by blocking the optical paths of the shared pixel, and/or by detrimentally affecting the conversion gain, fill factor, sensitivity of the image sensor. Thus, it may be desirable to reduce the interconnection/wiring associated with a shared pixel while maintaining the capability to read out each photodiode of the shared pixel individually.

Figure 3:
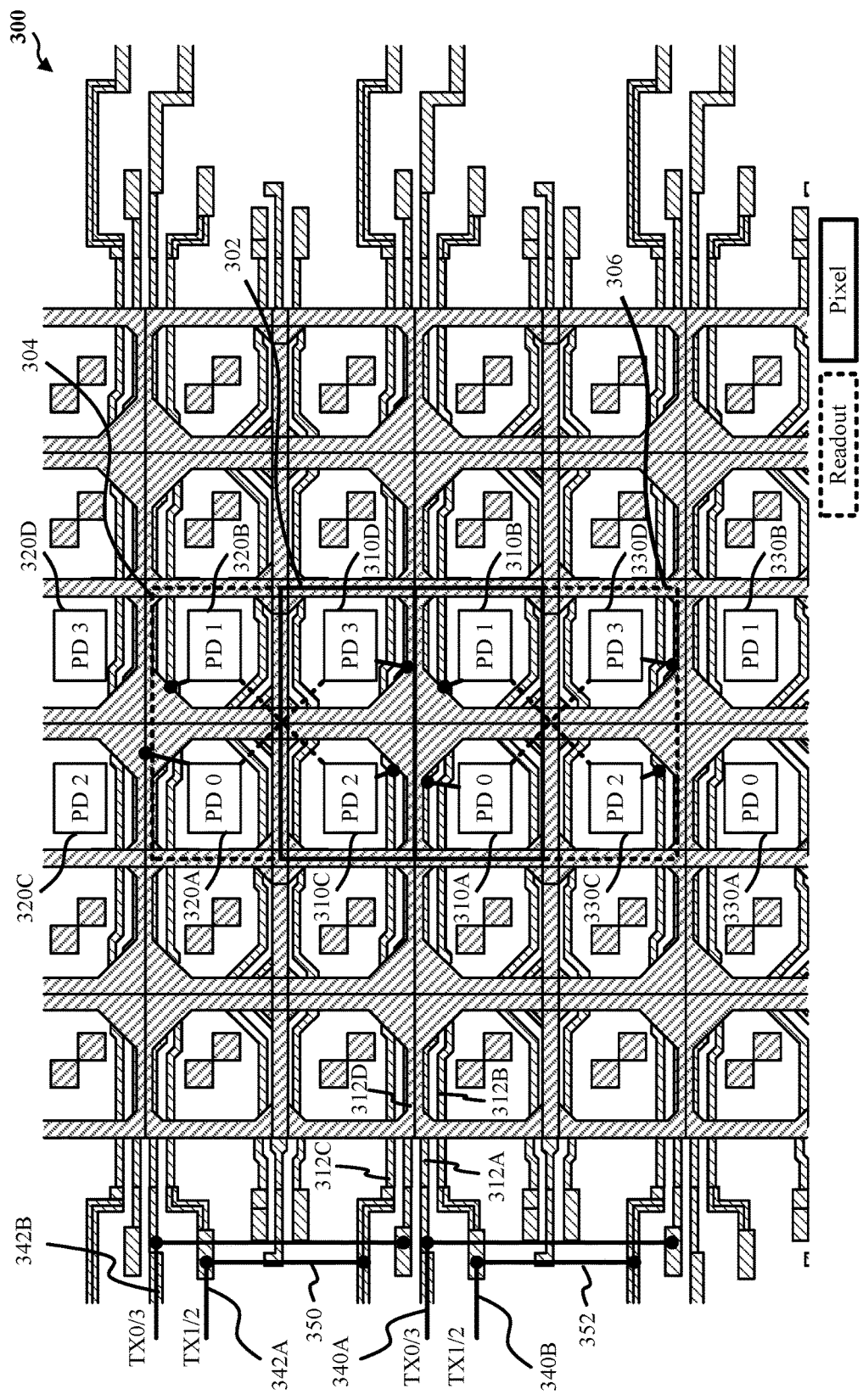
FIG. 3 illustrates a top-down view of a portion of a pixel array according to an exemplary embodiment.

FIG. 3 illustrates a top-down view of a portion of a pixel array 300 according to an exemplary embodiment. The pixel array 300 includes a multitude of shared pixels described above. For example, as shown in the middle of the exemplary pixel array 300, a shared pixel 302 is shown as a solid dark square and includes sub-pixels (i.e., photodiodes PD0-PD3) identified as photodiodes 310A-310D. As further shown, a shared pixel including photodiodes 320A, 320B, 320C and 320D is shown in the array row above the row of the shared pixel 302 and another shared pixel including photodiodes 330A, 330B, 330C and 330D is shown in the array row below the row of the shared pixel 302. In one configuration, each of the shared pixel 302, and the shared pixels above and below the shared pixel 302 may be the shared pixel 200 described above in FIG. 2.

According to the exemplary embodiment, there are six columns of subpixels in the array with pairs of columns each having a respective pair of subpixels that together form a pixel. Moreover, the pixel array 300 preferably comprises vertical shift registers that are 1125 lines deep, i.e., 1125 rows in the pixel array 300. Thus, in this embodiment, the platform for the array is limited to 1125 rows times six columns or 6750 lines at maximum speed.

As further shown, each of the photodiodes of pixel 302 are connected to its respective transfer gate as described above. Thus, photodiode 310A is connected to transistor 312A, photodiode 310B is connected to transistor 312B, photodiode 310C is connected to transistor 312C, and photodiode 310D is connected to transistor 312D. Although pixel 302 is illustrated with a solid line square, the pixel array 300 provides a cross connection of pixels such that sub-pixels of adjacent pixels are read out concurrently to minimize bandwidth. Each readout is illustrated with dashed lines and boxes. Thus, the sub-pixels forming the grouping of sub-pixels 306 may be read out first followed by the grouping of sub-pixels 304, as will become readily apparent based on the following disclosure.

Thus, photodiode 310C (PD2) of the shared pixel 302 may be read out concurrently when photodiode 320B (PD1) of the shared pixel in the row above is read out. In one configuration, photodiode 310C (PD2) may be read out during a first clock cycle, and photodiode 320B (PD1) may be read out during a second clock cycle. The first clock cycle and the second cycle may be consecutive clock cycles. Similarly, photodiode 310D (PD3) of the shared pixel 302 may be read out concurrently when photodiode 320A (PD0) of the shared pixel in the row above is read out. In one configuration, photodiode 310D (PD3) may be read out during a first clock cycle, and photodiode 320A (PD0) may be read out during a second clock cycle. The first clock cycle and the second cycle may be consecutive clock cycles.

Moreover, when photodiode 310A (PD0) of pixel 302 is read out, photodiode 330D (PD3) of the shared pixel in the row below may also get read out. In one configuration, photodiode 310A (PD0) may be read out during a first clock cycle, and photodiode 330D (PD3) may be read out during a second clock cycle. The first clock cycle and the second cycle may be consecutive clock cycles. Similarly, when photodiode 310B (PD1) of pixel 302 is readout, photodiode 330C (PD2) of the shared pixel in the row below may also get read out. In one configuration, photodiode 310B (PD1) may be read out during a first clock cycle, and photodiode 330C (PD2) may be read out during a second clock cycle. The first clock cycle and the second cycle may be consecutive clock cycles.

As explained above with reference to FIG. 2, to read out a value of a particular photodiode, the respective transfer gate must be activated. In this instance, transfer gate signals are applied to sub-pixels in adjacent rows, to read out two values concurrently. For example, as shown a transfer gate signal $TG_{0/3}$ (i.e., signal 340A) is applied to transistor 312A, such that the sub-pixel 310A can be read out as shown above. As further shown, this transfer gate signal 340A is also applied to the transfer gate for photodiode 330D on the adjacent row below the row of the shared pixel 302. During the same readout period that the transfer gate signal 340A is activated, the control circuit also activates transfer gate signal 340B, which activates the transfer gates for photodiode 310B of the shared pixel 302 and photodiode 330C (i.e., PD2) of the shared pixel directly below the shared pixel 302. As shown, transfer gate signal 340A and transfer gate signal 340B are in the same row of the shift register.

Furthermore, during the next readout period, transfer gate signals 342A and 342B will be applied in a similar manner. Transfer gate signals 342A activates the transfer gates for photodiode 310C of the shared pixel 302 and photodiode 320B of the shared pixel directly above the shared pixel 302 in the pixel array 300. Similarly, transfer gate signals 342B activates the transfer gates for photodiode 310D of the shared pixel 302 and photodiode 320A of the shared pixel directly above the shared pixel 302 in the pixel array 300.

Figure 4:
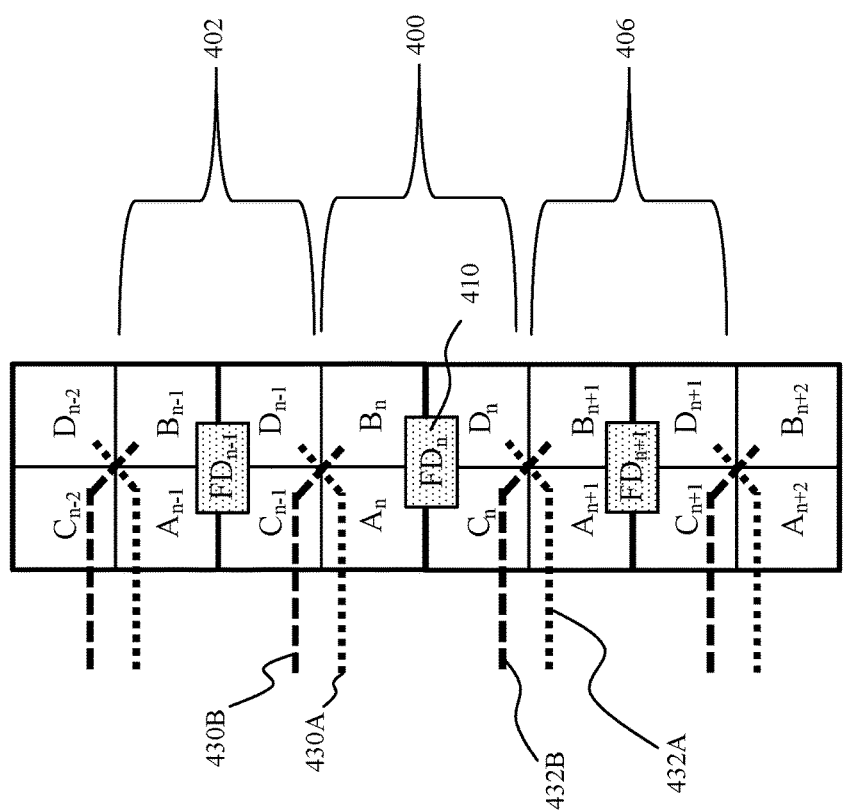
FIG. 4 illustrates a block diagram of a conceptual view of a portion of the pixel array shown in FIG. 3.

In one configuration, the interconnections (e.g., 350 and 352) that cross-couple transfer gates of two different shared pixels may be located at the edge of the image area, as illustrated in FIG. 4. In one configuration, the interconnections (e.g., 350 and 352) that cross-couple transfer gates of two different shared pixels may be located in the pixel grid (e.g., in the shared pixel 302 and the shared pixel above or below the shared pixel 302), thus reducing the amount of shift registers on the edge of the image area.

FIG. 4 illustrates a block diagram of a conceptual view of a portion of the pixel array shown in FIG. 3. In particular, the column shown in this figure includes a shared pixel 400 that includes sub-pixels $A_n$, $B_n$, $C_n$ and $D_n$. In one configuration, the shared pixel 400 may be the shared pixel 200 or 302 discussed above, and the sub-pixels $A_n$, $B_n$, $C_n$ and $D_n$ may correspond to sub-pixels 210A-210D or 310A-310D discussed above. Moreover, as described above, each 4T shared pixel includes a floating diffusion point, which is illustrated as $FD_n$ and denoted by 410. As further shown, a shared pixel 402 in the preceding row is formed by sub-pixels $A_{n-1}$, $B_{n-1}$, $C_{n-1}$ and $D_{n-1}$ (including floating diffusion point $FD_{n-1}$) and two sub-pixels $C_{n-2}$ and $D_{n-2}$ are formed above the shared pixel 402. Similarly, the row following the shared pixel 400 includes a shared pixel 406 formed by sub-pixels $A_{n+1}$, $B_{n+1}$, $C_{n+1}$ and $D_{n+1}$ (including floating diffusion point $FD_{n+1}$), and two sub-pixels $A_{n+2}$ and $B_{n+2}$ are formed below the shared pixel 406. For purposes of this disclosure, the row for each shared pixel can be considered as rows n−2, n−1, n, n+1 and n+2. For example, the shared pixel 400 is on row n, the shared pixel 402 is on row n−1, and the shared pixel 406 is on row n+1.

As described above, each transfer gate is activated for two adjacent sub-pixels in the vertical direction (relative to the array) that are in different adjacent pixel rows (e.g., in rows n−1 and n, or in rows n and n+1). Thus, the transfer gates for sub-pixels $C_{n-1}$ and $B_n$ may first be activated by transfer gate signal 430B. Since sub-pixels $C_{n-1}$ and $B_n$ are in different rows, i.e., different shared pixels, the values of the sub-pixels $C_{n-1}$ and $B_n$ may be read out during the same readout period. Next, a transfer gate signal 430A may be applied to activate sub-pixels $A_n$ and $D_{n-1}$. After the activation by the pair of transfer gate signals 430A and 430B, the CMOS image sensor has performed a readout of sub-pixels $A_n$, $B_n$, $C_{n-1}$, and $D_{n-1}$. It should be appreciated that this readout may correspond to the dashed box 306 shown in FIG. 3 in which sub-pixel 310A (e.g., $A_n$), sub-pixel 310B (e.g., $B_n$), sub-pixel 330C (e.g., $C_{n-1}$), and sub-pixel 330D (e.g., $D_{n-1}$), are all read out during one readout period.

Referring back to FIG. 4, during the next cycle of readout, transfer gate signals 432B and 432A may be applied to activate the corresponding sub-pixels. In a similar manner as described above, the transfer gates for sub-pixels $C_n$ and $B_{n+1}$ may first be activated by transfer gate signal 432B. Next, transfer gate signal 432A may be applied to activate sub-pixels $A_{n+1}$ and $D_n$. Accordingly, after the activation by the pair of transfer gate signals 432A and 432B, the CMOS image sensor has performed a readout of sub-pixels $C_n$, $D_n$, $A_{n+1}$ and $B_{n+1}$.

Figure 5:
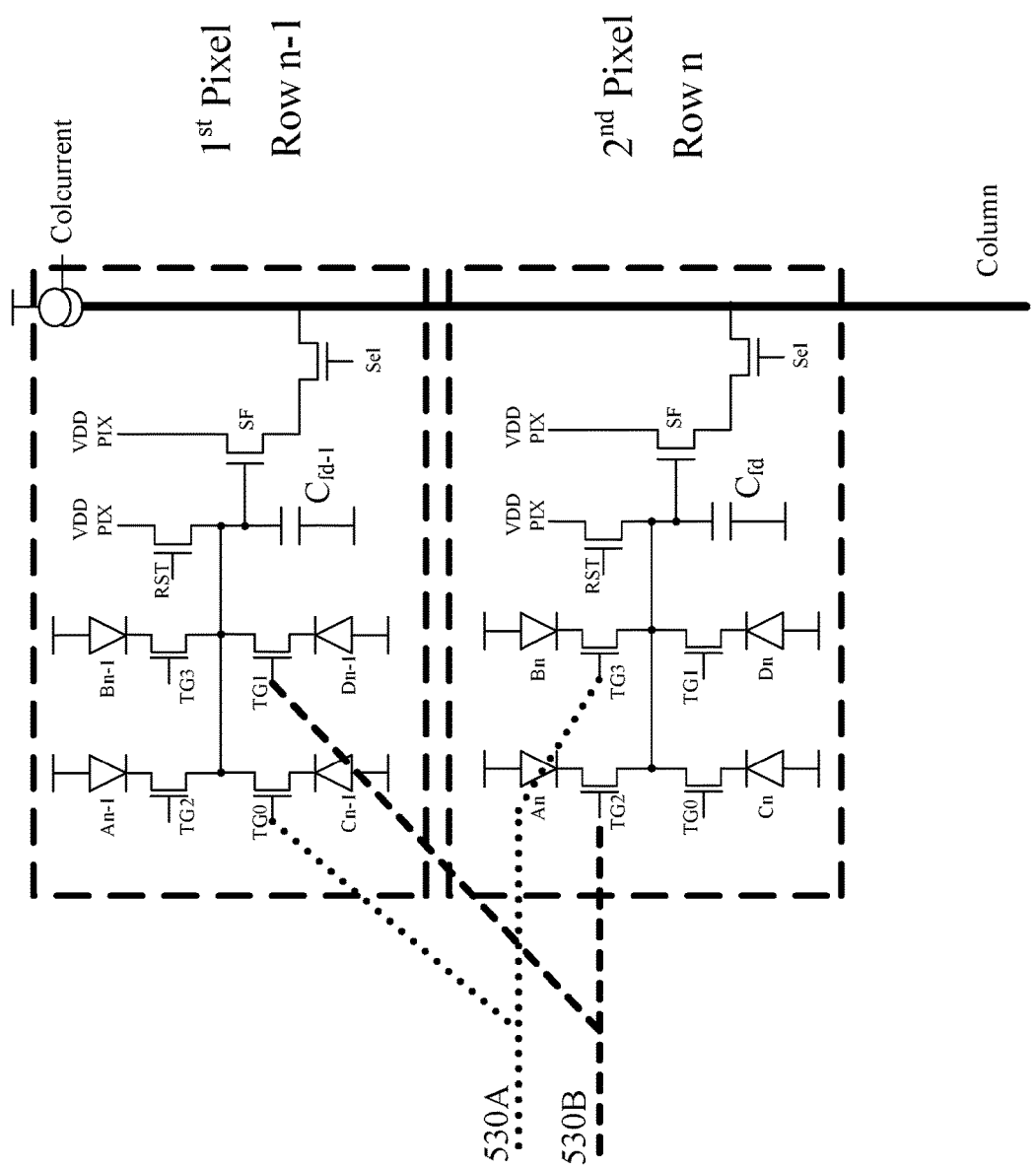
FIGS. 5 and 6 illustrate schematic diagrams of a plurality of 4T shared pixels in a pixel array of an image sensor according to an exemplary embodiment.
Figure 6:
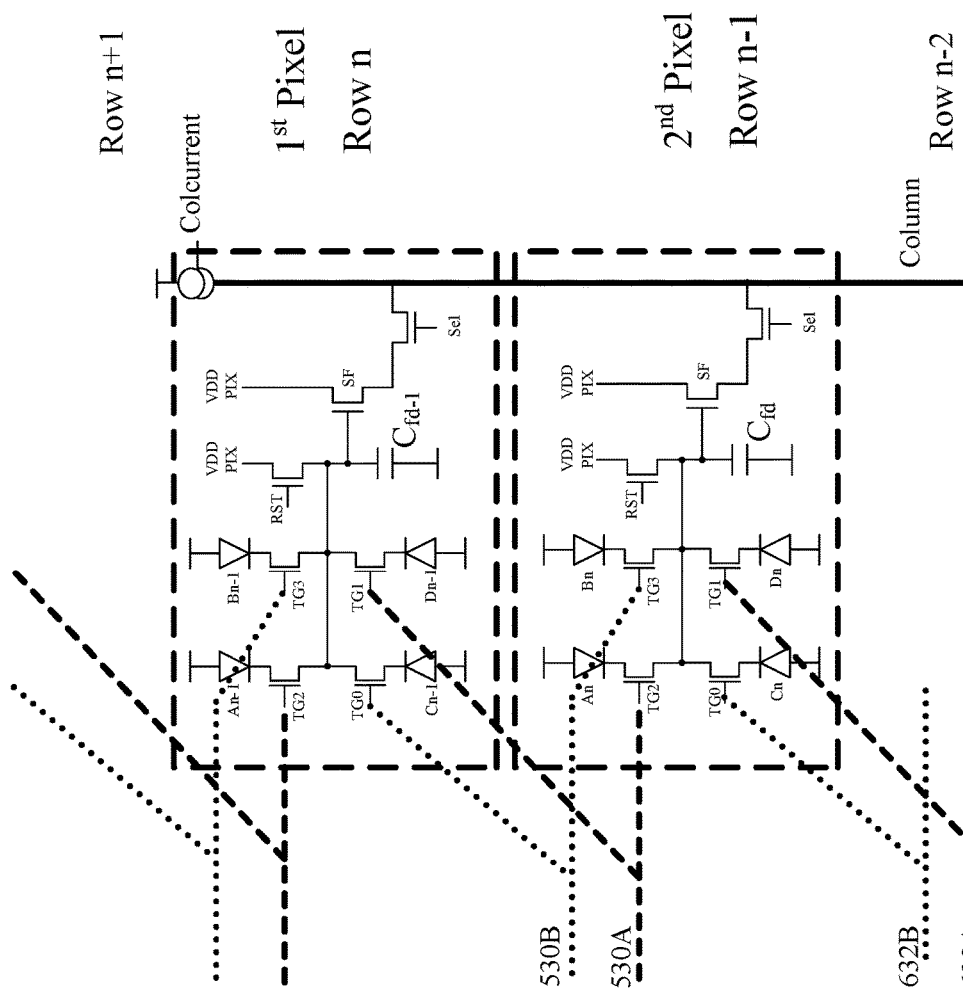

FIGS. 5 and 6 illustrate schematic diagrams of a plurality of 4T shared pixels in a pixel array of an image sensor according to an exemplary embodiment. As shown in FIG. 5, the pixel array includes a pair of adjacent rows, i.e., 1st pixel row n−1 and 2nd pixel row n, in the vertical direction of the pixel array. It should be appreciated that each separate shared pixel in row n and n−1 includes the same 4T shared transistor circuit configuration discussed above with respect to FIG. 2 and will not be repeated herein. As shown, one transfer gate signal 530A may be applied to the transfer gate (TG0) of sub-pixel $C_{n-1}$ and to the transfer gate (TG3) of sub-pixel $B_n$. Similarly, another transfer gate signal 530B may be applied to the transfer gate (TG2) of sub-pixel $A_n$ and to the transfer gate (TG1) of sub-pixel $D_{n-1}$. In one configuration, the transfer gate signals 530A and 530B may be the transfer gate signals 340A and 340B, 342A and 342B, 430A and 430B, or 432A and 432B described above.

FIG. 6 illustrates the same pixel array circuit diagram as in FIG. 5 and also shows application of additional transfer gate signals 632A and 632B, which are the same transfer gate signals described above. In both FIGS. 5 and 6, the output of each sub-pixel is connected to the column circuit to provide readouts.

Figure 7:
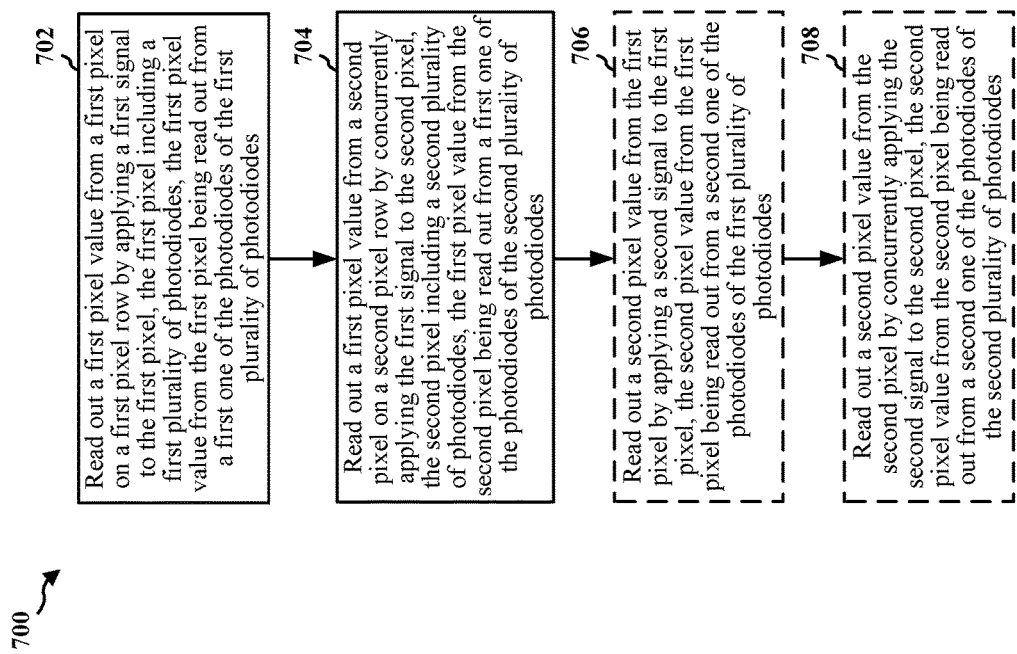
FIG. 7 is a flowchart of a method of performing digital sampling of pixel values of a CMOS image sensor.

FIG. 7 is a flowchart 700 of a method of performing digital sampling of pixel values of a CMOS image sensor. The method may be performed by an apparatus that includes a CMOS image sensor. The CMOS image sensor may include a pixel array, which may include a multitude of shared pixels as described above. At 702, the apparatus may read out a first pixel value from a first pixel (e.g., the shared pixel 400) on a first pixel row by applying a first signal (e.g., the transfer gate signal 430A) to the first pixel. The first pixel may include a first plurality of photodiodes. The first pixel value from the first pixel may be read out from a first one of the photodiodes of the first plurality of photodiodes (e.g., $A_n$).

At 704, The apparatus may read out a first pixel value from a second pixel (e.g., the shared pixel 402) on a second pixel row by concurrently applying the first signal (e.g., the transfer gate signal 430A) to the second pixel. The second pixel may include a second plurality of photodiodes. The first pixel value from the second pixel may be read out from a first one of the photodiodes of the second plurality of photodiodes (e.g., $D_{n-1}$).

In one configuration, the first pixel row may be adjacent to the second pixel row, and the first pixel may be adjacent to the second pixel. In one configuration, the first one of the photodiodes of the first plurality of photodiodes (e.g., $A_n$) and the first one of the photodiodes of the second plurality of photodiodes (e.g., $D_{n-1}$) may be on different columns. In one configuration, the first pixel value from the first pixel may be read out during a first clock cycle, and the first pixel value from the second pixel may be read out during a second clock cycle. The first clock cycle and the second clock cycles may be consecutive clock cycles.

At 706, the apparatus may optionally read out a second pixel value from the first pixel (e.g., the shared pixel 400) by applying a second signal (e.g., the transfer gate signal 430B) to the first pixel. The second pixel value from the first pixel may be read out from a second one of the photodiodes of the first plurality of photodiodes (e.g., $B_n$).

At 708, the apparatus may optionally read out a second pixel value from the second pixel (e.g., the shared pixel 402) by concurrently applying the second signal (e.g., the transfer gate signal 430B) to the second pixel. The second pixel value from the second pixel may be read out from a second one of the photodiodes of the second plurality of photodiodes (e.g., $C_{n-1}$).

In one configuration, the second one of the photodiodes of the first plurality of photodiodes (e.g., $B_n$) and the second one of the photodiodes of the second plurality of photodiodes (e.g., $C_{n-1}$) may be on different columns. In one configuration, the second pixel value from the first pixel may be read out during a first clock cycle, and the second pixel value from the second pixel may be read out during a second clock cycle. The first clock cycle and the second clock cycles may be consecutive clock cycles.

In one configuration, the apparatus may include a first row of pixels including a first pixel (e.g., the shared pixel 402). The first pixel may include a first plurality of photodiodes and a first plurality of transfer gates. Each of the first plurality of photodiodes may be associated with a corresponding one of the first plurality of transfer gates. The apparatus may include a second row of pixels including a second pixel (e.g., the shared pixel 400). The second pixel may include a second plurality of photodiodes and a second plurality of transfer gates. Each of the second plurality of photodiodes may be associated with a corresponding one of the second plurality of transfer gates. A first one of the transfer gates of the first plurality of transfer gates (e.g., the transfer gate associated with $D_{n-1}$) may be coupled to a first one of the transfer gates of the second plurality of transfer gates (e.g., the transfer gate associated with $A_n$).

In one configuration, the connection for coupling the first one of the transfer gates of the first plurality of transfer gates (e.g., the transfer gate associated with $D_{n-1}$) and the first one of the transfer gates of the second plurality of transfer gates (e.g., the transfer gate associated with $A_n$) may be at the edge of an image area. The image area may include the first row of pixels and the second row of pixels. In one configuration, the connection for coupling the first one of the transfer gates of the first plurality of transfer gates (e.g., the transfer gate associated with $D_{n-1}$) and the first one of the transfer gates of the second plurality of transfer gates (e.g., the transfer gate associated with $A_n$) may be at the first pixel (e.g., the shared pixel 402) and the second pixel (e.g., the shared pixel 400).

In one configuration, a first one of the photodiodes of the first plurality of photodiodes (e.g., $D_{n-1}$) may be associated with the first one of the transfer gates of the first plurality of transfer gates, and a first one of the photodiodes of the second plurality of photodiodes is associated with the first one of the transfer gates of the second plurality of transfer gates (e.g., $A_n$). In one configuration, the first one of the photodiodes of the first plurality of photodiodes (e.g., $D_{n-1}$) and the first one of the photodiodes of the second plurality of photodiodes (e.g., $A_n$) may be on different columns. In one configuration, the first row of pixels may be adjacent to the second row of pixels. The first pixel may be adjacent to the second pixel.

In one configuration, a second one of the transfer gates of the first plurality of transfer gates (e.g., the transfer gate associated with $C_{n-1}$) may be coupled to a second one of the transfer gates of the second plurality of transfer gates (e.g., the transfer gate associated with $B_n$). In one configuration, the connection for coupling the second one of the transfer gates of the first plurality of transfer gates (e.g., the transfer gate associated with $C_{n-1}$) and the second one of the transfer gates of the second plurality of transfer gates (e.g., the transfer gate associated with $B_n$) may be at the edge of an image area. The image area may include the first row of pixels and the second row of pixels. In one configuration, the connection for coupling the second one of the transfer gates of the first plurality of transfer gates (e.g., the transfer gate associated with $C_{n-1}$) and the second one of the transfer gates of the second plurality of transfer gates (e.g., the transfer gate associated with $B_n$) may be at the first pixel (e.g., the shared pixel 402) and the second pixel (e.g., the shared pixel 400).

In one configuration, the apparatus may further include a third row of pixels comprising a third pixel (e.g., the shared pixel 406). The third pixel may include a third plurality of photodiodes and a third plurality of transfer gates. Each of the third plurality of photodiodes may be associated with a corresponding one of the transfer gates of the third plurality of transfer gates.

In one configuration, the second row of pixels may be adjacent to the third row of pixels, and the second row of pixels may be located between the first row of pixels and the third row of pixels. In one configuration, the second pixel (e.g., the shared pixel 400) may be adjacent to the third pixel (e.g., the shared pixel 406). In one configuration, the second pixel (e.g., the shared pixel 400) may be located between the first pixel (e.g., the shared pixel 402) and the third pixel (e.g., the shared pixel 406).

In one configuration, a third one of the transfer gates of the second plurality of transfer gates (e.g., the transfer gate associated with $C_n$) may be coupled to a first one of the transfer gates of the third plurality of transfer gates (e.g., the transfer gate associated with $B_{n+1}$). In one configuration, a fourth one of the transfer gates of the second plurality of transfer gates (e.g., the transfer gate associated with $D_n$) may be coupled to a second one of the transfer gates of the third plurality of transfer gates (e.g., the transfer gate associated with $A_{n+1}$). In one configuration, the connection for cross coupling the transfer gates may be at the edge of an image area. The image area may include the second row of pixels and the third row of pixels. In one configuration, the connection for cross coupling the transfer gates may be at the second pixel (e.g., the shared pixel 400) and the third pixel (e.g., the shared pixel 406).

Figure 8:
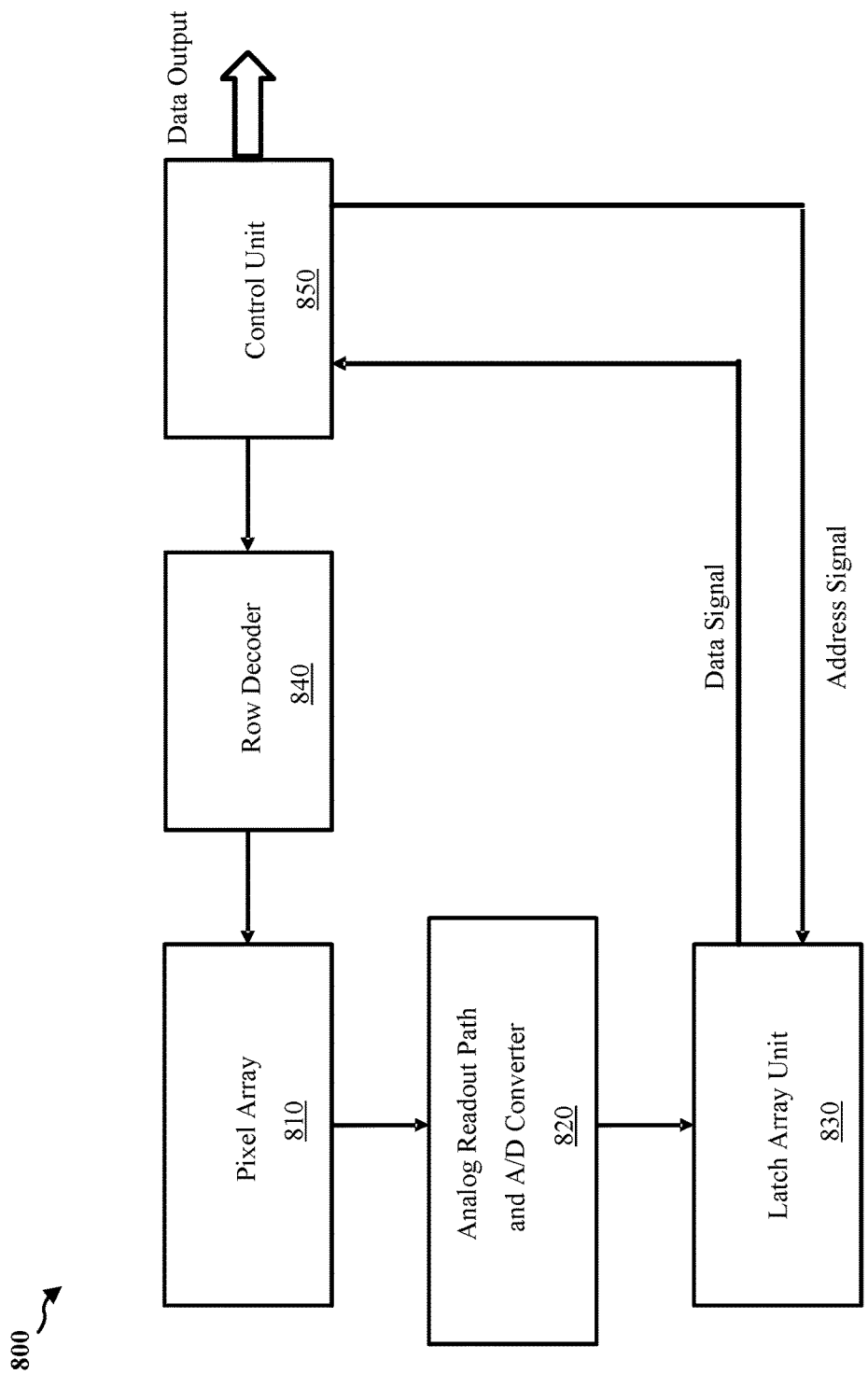
FIG. 8 illustrates a block diagram of a CMOS image sensor according to an exemplary embodiment.

FIG. 8 illustrates a block diagram of a CMOS image sensor according to an exemplary embodiment. As shown, the CMOS image sensor 800 includes a pixel array 810, which can be, for example, pixel array 300 described above that includes a multitude of 4T shared pixel configurations. Furthermore, the output of the pixel array 810 may be fed to an analog readout path and A/D converter 820, which is provided for processing the analog output voltages from the pixel array 810 to convert analog pixel signals into digital signals. It should be understood that the analog readout path and A/D converter 820 is known to those skilled in the art.

As further shown, a latch array unit (or line buffer) 830 is provided for storing the digital signals outputted from the analog readout path and A/D converter 820. It should be appreciated that the line buffer 830 can include multiple lines depending on the readout order of the pixels of pixel array 810. Moreover, a control unit 850 is provided for providing control signals used in controlling the aforementioned units and outputting data to the outside (e.g., a display unit) through an interface. For example, the control unit 850 in conjunction with row decoder 840 can generate the activating signals. Moreover, in one embodiment, the control unit 850 can also generate the control signals to open and close the switches of the capacitor readout.

The control unit 850 may include one or more processors and one or more modules for executed the control algorithms described herein. The modules may be software modules running in the processor, or resident/stored in memory, one or more hardware modules coupled to the processor, or some combination thereof. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Furthermore, the control unit 850 may be coupled to a row decoder 840 that is configured to output the signals for selecting the rows in the pixel array 810 based on a control signal transmitted from the control unit 850.

Preferably, the analog readout path and A/D converter 820 may include comparators as many as the number of columns of the pixel array 810 as described above. Each of the comparators serves a role of converting an analog pixel value of a column in which it is located into a digital signal. The digital signal is stored in the latch array unit 830 including latches as many as the number of the columns of the pixel array 810. The digital signals stored in the latch array unit 830 are subjected to an image processing by the control unit 850 and then, sequentially outputted through output pins of the image sensor in the image processed order.

According to the disclosure herein, the exemplary method and sensor provide for an efficient readout of pixel values from a pixel array that reduces the required output bandwidth and enables digital double sampling through the whole analog chain of the pixel array. Moreover, using the disclosed technique, effects like Black sun and fluctuating analog disturbances are avoided and suppressed.

In one configuration, to reduce interconnections in the pixel or pixel array, two transfer gates belonging to two different shared pixels (e.g., two shared pixels on two adjacent rows) may be connected. As a result, two floating diffusions of the two shared pixels are read out at the same time (e.g., during the same readout period). By cross coupling two transfer gates on two different rows, two shared pixels may be operated in parallel. This configuration may reduce the amount of wiring needed for the vertical shift registers for addressing the pixels or sub-pixels. For example, for a shared pixel with four photodiodes, the number of interconnections to address the shared pixel may be reduced from four wires to two wires. With reduced wiring in the shared pixel, the pixel performance (e.g., conversion gain, fill factor, sensitivity of the shared pixel) may improve due to lower complexity in wiring.

It should be appreciated that in the examples above, all switching signals are assumed to be positive logic signals, i.e. a high level, or "1" results in closing the switch. It is, however, also possible to use an inverted logic, or to use both, positive and negative, logic in a mixed manner. Moreover, the disclosed CMOS image sensor and method provides an increased speed of the overall readout circuit. In one aspect, the increase in the speed of the readout circuit allows for an increase in the number of pixels in a matrix, which is a key feature for high definition imaging.

While aspects have been described in conjunction with the example implementations outlined above, various alternatives, modifications, variations, improvements, and/or substantial equivalents, whether known or that are or may be presently unforeseen, may become apparent to those having at least ordinary skill in the art. Accordingly, the example implementations of the invention, as set forth above, are intended to be illustrative, not limiting. Various changes may be made without departing from the spirit and scope of the aspects. Therefore, the aspects are intended to embrace all known or later-developed alternatives, modifications, variations, improvements, and/or substantial equivalents.

The previous description is provided to enable any person skilled in the art to fully understand the full scope of the disclosure. Modifications to the various exemplary embodiments disclosed herein will be readily apparent to those skilled in the art. Thus, the claims should not be limited to the various aspects of the disclosure described herein, but shall be accorded the full scope consistent with the language of claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), or analogous law in jurisdictions other than the United States, unless the element is expressly recited using the phrase "means for" or, in the case of a method claim, the element is recited using the phrase "step for."

What is claimed is:
1. A CMOS image sensor, comprising:
 a first linear row of pixels comprising a first pixel, the first pixel including:
 a first plurality of photodiodes,
 a first plurality of transfer gates, coupled to a corresponding one of the first plurality of photodiodes,
 a first common readout circuit that includes a first common storage node physically positioned between each of the first plurality of photodiodes and a first readout channel and that is configured to store an output voltage from each of the first plurality of photodiodes and output the stored output voltage to the first readout channel;

and a second linear row of pixels comprising a second pixel and disposed below the first linear row of pixels in the CMOS image sensor, such that the second pixel is symmetrically configured directly below the first pixel of the first linear row of pixels and includes:

a second plurality of photodiodes, a second plurality of transfer gates, coupled to a corresponding one of the second plurality of photodiodes, and a second common readout circuit that includes a second common storage node physically positioned between each of the second plurality of photodiodes and a second readout channel and that is configured to store an output voltage from each of the second plurality of photodiodes and output the stored output voltage to the second readout channel, wherein each transfer gates of the first plurality of transfer gates is coupled to a corresponding transfer gates of the second plurality of transfer gates, and wherein a control unit is configured to sequentially activate each transfer gate of the first plurality of transfer gates and concurrently activate each corresponding transfer gate of the second plurality of transfer gates, such that the respective output voltages from the respective photodiodes is concurrectly read out on the first and second readout channels, respectively, as the control unit sequentially activates the respective transfer gates of the first and second pixels.

2. The CMOS image sensor of claim 1, wherein a first one of the photodiodes of the first plurality of photodiodes is associated with a first transfer gate of the first plurality of transfer gates, and a first photodiode of the second plurality of photodiodes is associated with a first transfer gate of the second plurality of transfer gates, wherein the first photodiode of the first plurality of photodiodes and the first photodiode of the second plurality of photodiodes are on different columns.

3. The CMOS image sensor of claim 1, wherein the first row of pixels is adjacent to the second row of pixels.

4. The CMOS image sensor of claim 1, wherein the first pixel is adjacent to the second pixel.

5. The CMOS image sensor of claim 1, wherein a second transfer gate of the first plurality of transfer gates is coupled to a second transfer gate of the second plurality of transfer gates.

6. The CMOS image sensor of claim 5, further comprising:

a third row of pixels comprising a third pixel, the third pixel including:

a third plurality of photodiodes, a third plurality of transfer gates coupled to a corresponding one of the third plurality of photodiodes, and a third common readout circuit that includes a third common storage node physically positioned between each of the third plurality of photodiodes and a third readout channel and that is configured to store an output voltage from each of the third of photodiodes and output the stored output voltage to the third readout channel.

7. The CMOS image sensor of claim 6, wherein the second row of pixels is adjacent to the third row of pixels, wherein the second row of pixels is located between the first row of pixels and the third row of pixels.

8. The CMOS image sensor of claim 6, wherein the second pixel is adjacent to the third pixel, wherein the second pixel is located between the first pixel and the third pixel.

9. The CMOS image sensor of claim 6, wherein a third transfer gate of the second plurality of transfer gates is coupled to a first transfer gate of the third plurality of transfer gates.

10. The CMOS image sensor of claim 9, wherein a fourth transfer gate of the second plurality of transfer gates is coupled to a second transfer gate of the third plurality of transfer gates.

11. The CMOS image sensor of claim 1, wherein a connection for coupling a first transfer gate of the first plurality of transfer gates and a first transfer gate of the second plurality of transfer gates is at an edge of an image area, the image area comprising the first row of pixels and the second row of pixels.

12. The CMOS image sensor of claim 1, wherein a connection for coupling a first transfer gate of the first plurality of transfer gates and a first transfer gate of the second plurality of transfer gates is at the first pixel and the second pixel.

13. A CMOS image sensor, comprising:

a plurality of rows of pixels each comprising at least one pixel that includes:

a plurality of photodiodes, a plurality of transfer gates coupled to a corresponding one of the plurality of photodiodes, and a common readout circuit that includes a common storage node configured to store an output voltage from each of the plurality of photodiodes and output the stored output voltage to a respective readout channel, wherein each of the plurality of rows of pixels are disposed in a linear configuration with each row of pixels being on top of or below an adjacent row of pixels, wherein each row of pixels is disposed in a configuration having a same symmetrical layout as an adjacent row of pixels directly above or directly below the respective row of pixels, and wherein a control unit is configured to sequentially activate each transfer gate of the plurality of transfer gates of the respective row of pixels and concurrently activate each corresponding transfer gate of the plurality of transfer gates in the respective adjacent row of pixels, such that the respective output voltages from the respective photodiodes is concurrently read out on the readout channels as the control unit sequentially activates the respective transfer gates.

14. The CMOS image sensor of claim 13, wherein the common storage node of the at least one pixel of the plurality of row of pixels is physically positioned between each of the plurality of photodiodes and the readout channel, respectively.

* * * * *